United States Patent [19]

Poittevin et al.

[11] Patent Number: 5,726,575

[45] Date of Patent: Mar. 10, 1998

[54] PATH FOR ACQUIRING A VOLTAGE PULSE, AND A METHOD AND A SYSTEM FOR MEASURING PARTIAL DISCHARGES AND PROVIDED WITH SUCH A PATH

[75] Inventors: Jean Poittevin, Courbevoie; Mohamed Ryadi, Le Mans; Jean-Claude Bonnet; Jacques Mazankine, both of Gouaix, all of France

[73] Assignee: GEC Alsthom T & D SA, Paris, France

[21] Appl. No.: 522,920

[22] Filed: Sep. 1, 1995

[30] Foreign Application Priority Data

Sep. 2, 1994 [FR] France .................. 94 10573

[51] Int. Cl.$^6$ .................................. G01R 31/00
[52] U.S. Cl. .......... 324/536; 324/601; 324/544; 364/551.04
[58] Field of Search .................... 324/536, 541, 324/544, 551; 364/551.01

[56] References Cited

U.S. PATENT DOCUMENTS

| | | | |
|---|---|---|---|
| 3,421,076 | 1/1969 | Eigen | 324/544 |
| 3,602,706 | 8/1971 | Levitt | 364/551.01 |
| 3,777,259 | 12/1973 | Clinton | 324/601 |
| 3,861,780 | 1/1975 | Ross | 364/551.01 |
| 4,663,586 | 5/1987 | Swerlein | 324/601 |
| 4,757,263 | 7/1988 | Cummings et al. | 324/552 |
| 4,780,661 | 10/1988 | Baloney et al. | 324/601 |
| 5,047,725 | 9/1991 | Strid et al. | 324/601 |
| 5,247,258 | 9/1993 | Tripier et al. | 324/54 |
| 5,256,976 | 10/1993 | Ishikawa et al. | 324/544 |
| 5,319,311 | 6/1994 | Kawashima et al. | 324/544 |
| 5,477,150 | 12/1995 | Ham, Jr. et al. | 324/536 |
| 5,514,967 | 5/1996 | Zelm | 324/551 |

FOREIGN PATENT DOCUMENTS

| | | | |
|---|---|---|---|
| 0205312 | 12/1983 | Germany | 324/536 |
| 2034140 | 5/1990 | United Kingdom. | |
| WO9001704 | 2/1990 | WIPO. | |

*Primary Examiner*—Maura K. Regan
*Attorney, Agent, or Firm*—Sughrue, Mion, Zinn, Macpeak & Seas, PLLC

[57] ABSTRACT

The invention relates to an acquisition path for acquiring a voltage pulse, and to a system and a method making use of said path, the path comprises:

a path input for a pulse signal;

a module for determining the polarity and for limiting acquisition of the input signal;

a control module for controlling acquisition and for storing the polarized peak value of the input signal;

a detect-and-hold module for detecting the polarized peak value of the signal being acquired, and for holding it; and selection means for selecting the rating of the signal being acquired;

according to the invention the selection module for selecting the rating of the signal being acquired comprises a plurality of measurement ranges all of which are connected at their upstream ends to the path input, and all of which are connected at their downstream ends to automatic selection means for automatically selecting the optimum measurement range for the signal being acquired.

13 Claims, 5 Drawing Sheets

| PARAMETERS | PATH | UNITS |
|---|---|---|
| FILE NAME | | |
| TEST DATE | | |
| TEST DURATION | 100 | S |
| START OF TEST | 0 | |
| END OF TEST | 5000 | |
| No OF PERIODS | 5000 | |
| No OF PDS | 52948 | |
| AVERAGE OF PD VOLTS | -30 | V |
| AVERAGE OF \|PD VOLTS\| | 80 | V |
| ENERGY | 2348 | KJ |
| SKEW | 2 | |
| CUROSIS | -1 | |

PATH FOR ACQUIRING A VOLTAGE PULSE, AND A METHOD AND A SYSTEM FOR MEASURING PARTIAL DISCHARGES AND PROVIDED WITH SUCH A PATH

The invention relates to a path for acquiring a voltage pulse, and to a method of measuring partial discharges implemented in a system for measuring partial discharges, the system including at least one such path.

BACKGROUND OF THE INVENTION

Partial discharges take place, in particular, in equipment used in high tension installations in networks for transporting or distributing electricity. A partial discharge is a dielectric breakdown phenomenon that occurs in a portion only of the insulation between two conductors without giving rise to total breakdown of the components concerned.

The signature of a partial discharge at various points in the apparatus that has suffered the discharge can provide information concerning the aging of certain components. As a result, analysis of such signatures can considerably improve predictive maintenance means, particularly in high tension electricity installations.

Single-path systems are known for acquiring partial discharges that enable an average to be obtained of the partial discharges detected over a half-period of the reference voltage. If it is desired to perform high quality predictive maintenance, it is necessary to obtain a partial discharge signature that is more accurate. Averaging over a half-period gives rise to losses of information.

In the single-path acquisition systems described above, the received signals are rated manually. Unfortunately, a partial discharge may generate pulse signals over an extremely wide range of amplitudes, running from a few millivolts to a few hundreds of volts. In addition, the pulses last for a few microseconds. As a result manual rating of the signals is not effective. If the lower threshold of the chosen rating is too high, then certain signals of lower amplitude are not detected, and if the upper threshold is too low, then information concerning signals of larger amplitude is erroneous. In addition, manual adjustment requires the continuous presence of an extremely vigilant operator.

Finally, those apparatuses are single-path apparatuses. Unfortunately, if predictive maintenance is to be effective, the signature of a partial discharge needs to be picked up from a plurality of measurement points and the resulting information cross-checked. With such apparatuses, it is therefore necessary to use as many single-path apparatuses as there are measurement points.

Multipath systems are known for measuring partial discharges that enable the latter drawback to be overcome. One such system is described in FR-A-2 635 192.

That system comprises a plurality of paths, each having:
a path input for a pulse signal detected at a measurement point of said electrical apparatus;
a module for determining polarity and for limiting acquisition to detect the polarity of the input signal and to limit pulse acquisition to input signals exceeding predetermined threshold values;
a detect-and-hold module for detecting the polarized peak value of the signal being acquired and for holding it during a predetermined given length of time; and
a control module.

All of the paths are connected to a computer or equivalent via a common multiplexer interface which digitizes the results of acquisition on each of the paths, one after another.

That system does not allow for any rating to be performed. Information is therefore lost if the rating of the path does not enable certain signals of low amplitude to be detected, and information is erroneous for signals of large amplitude that saturate the rating.

In addition, the use of a single digitizing device for all of the paths via a multiplexer, leads to data storage times that are too long, thereby increasing the minimum time required to perform a measurement on a path. This increase in time can give rise to measurement of a discharge being lost if the discharge takes place while a measurement is being performed.

OBJECTS AND SUMMARY OF THE INVENTION

An object of the present invention is to provide paths having automatic modules for performing rating in such a manner that for a given single amplitude, the module selects the optimum measurement rating.

Another object of the present invention is to make the paths independent with respect to digitizing and data storage so as to reduce the time required to perform a measurement.

Another object of the present is to provide a multipath measurement system and a method enabling a series of measurements to be subjected to post-treatment without simultaneously interrupting the measurements that are taking place.

To this end, the invention relates to a path for acquiring a voltage pulse that is measured in an electrical apparatus. The path comprises:
a path input for a pulse signal detected at a measurement point of said electrical apparatus;
a module for determining polarity and for limiting acquisition to detect the polarity of the input signal and to limit pulse acquisition to an input signal exceeding predetermined threshold values;
a control module for controlling acquisition and storage of the polarized peak value of the input signal if the input signal exceeds the predetermined threshold values;
a detect-and-hold module for detecting the polarized peak value of the signal being acquired and for holding it during a predetermined given length of time; and
a selection module for selecting the rating of the signal being acquired.

According to the invention, the selection module for selecting the rating of the signal being acquired comprises a plurality of measurement ranges, all connected at their upstream ends to the input of the path, and all connected at their downstream ends to the automatic selection means for automatically selecting the measurement range which is optimum for the signal being acquired. Automatic optimum measurement calibration is thus made possible on the input signal.

Each measurement range includes a detect-and-hold module.

According to the invention, each measurement range includes an amplifier of known gain and of known saturation voltage, the automatic selection means including means for scanning the plurality of measurement ranges in order of decreasing amplifier gain, and means for selecting the first non-saturated measurement range in scan order.

The detect-and-hold module is located downstream from the amplifier and upstream from the automatic selection means in each measurement range.

The detect-and-hold module comprises analog detect-and-hold means connected in series with digitizing means for digitizing the detected polarized peak value and held.

The acquisition path of the invention includes a storage module for storing the detected polarized peak value as selected and made available at the output of the selection module.

Advantageously, the path of the invention includes adjustment means for adjusting the predetermined threshold values, and controllable selection means for selecting the measurement range to be connected to the module for determining polarity and for limiting pulse acquisition.

The invention also provides a system for measuring partial discharges in an electrical apparatus, the system comprising:

at least one acquisition path as described above;

a reference path for digitizing and storing the polarized feed voltage of the electrical apparatus; and a transfer module for transferring to a common archive file located in a microcomputer or equivalent, the digitized polarized peak values as stored in the storage module of the acquisition path, together with the associated feed polarized voltage as stored in the reference path.

The microcomputer or equivalent includes means for processing the data in the common file and display means and means for outputting said data or the results of processing said data.

Advantageously, the system comprises seven acquisition paths and one reference path, each acquisition path having four measurement ranges which, in combination, provide a dynamic measurement range of about one to one million.

Finally, the invention also provides an acquisition method in which:

the acquisition paths are connected to the selected measurement points in the electrical apparatus;

the reference path is connected to one of the feed voltages of the electrical apparatus;

a signal appears at the input of the acquisition path. This signal is distributed to all of the measurement ranges and, via the controllable selection means, to the module for determining polarity and for limiting acquisition.

The module for determining polarity and for limiting acquisition determines the polarity of the signal, and compares the value of the signal with threshold values, and if the threshold values are exceeded, it generates a trigger command which is applied to all of the detect-and-hold modules, and also to the control module which begins a time delay by using the shift means.

During this time delay, the detect-and-hold modules have enough time to detect the peak value of the signal by using analog means. At the end of the time delay, the control module activates the digitizing means to cause them to digitize the peak value of the signal.

During the time delay, or at the end of it, the control module generates an acquisition command for the reference path. This path acquires, digitizes, and stores the number of the period and the polarized value of the reference voltage at that instant.

The automatic selection means scans the measurement ranges in order of decreasing gain, and it selects the first digitized value that is below the saturation threshold for the measurement range from which it is delivered.

The control module then causes the selected value to be stored, and then activates reinitialization of the modules to wait for a new signal.

A first advantage of the present invention is automatic rating of the input signal by means of the selection module. Thus, each acquisition is properly rated and no longer constitutes a potential vector for erroneous information. In addition, this automatic module does not require any operator.

Another advantage of the present invention is having a respective digitizing device integrated within each path. This considerably increases acquisition speed. Each path can digitize and store its own data independently of the other paths.

BRIEF DESCRIPTION OF THE DRAWINGS

Other advantages and characteristics of the present invention appear from the following description given with reference to the accompanying drawings, in which.

MORE DETAILED DESCRIPTION

Figure 1:
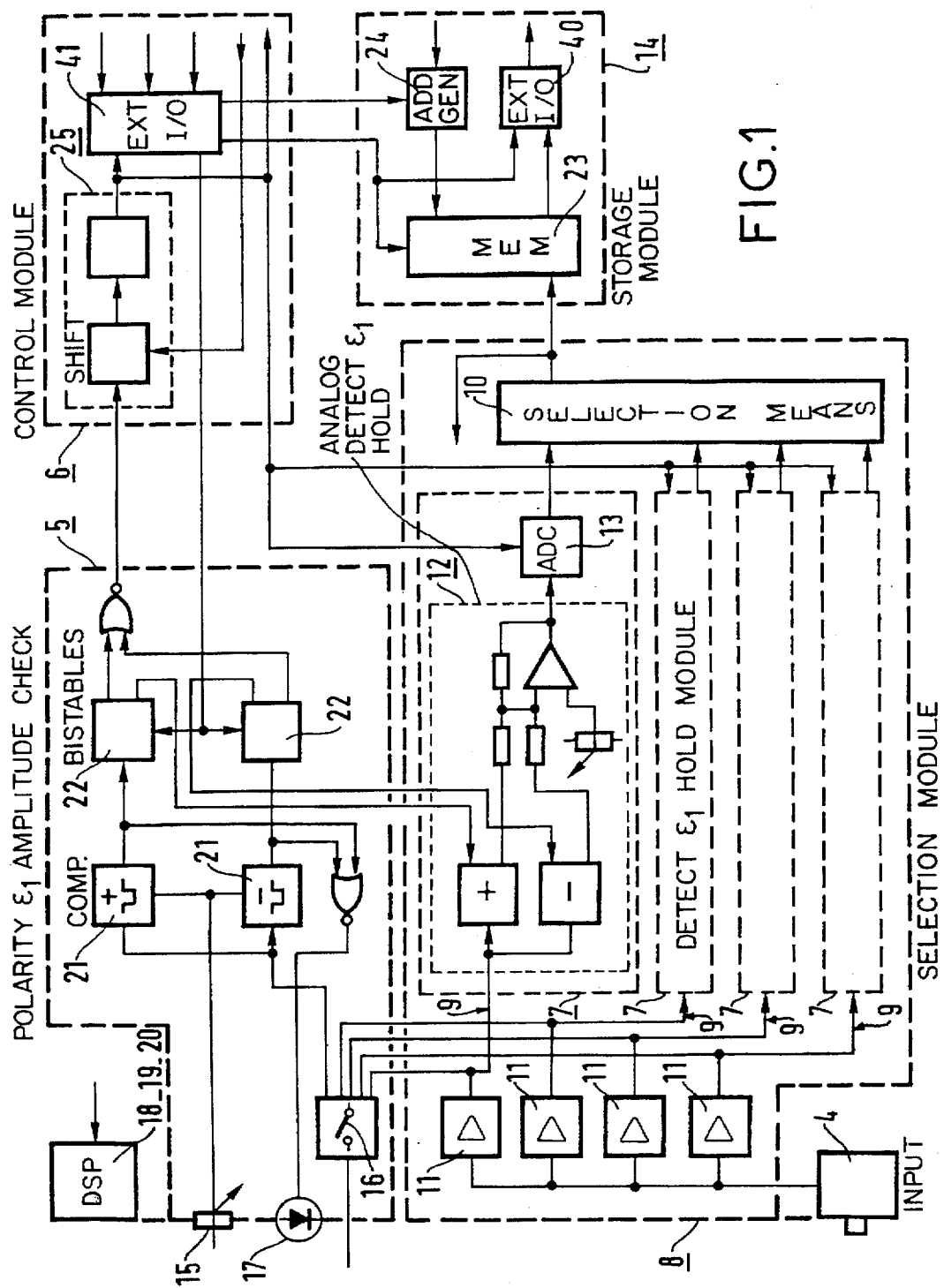
FIG. 1 is a block diagram of a path of the invention.
Figure 2:
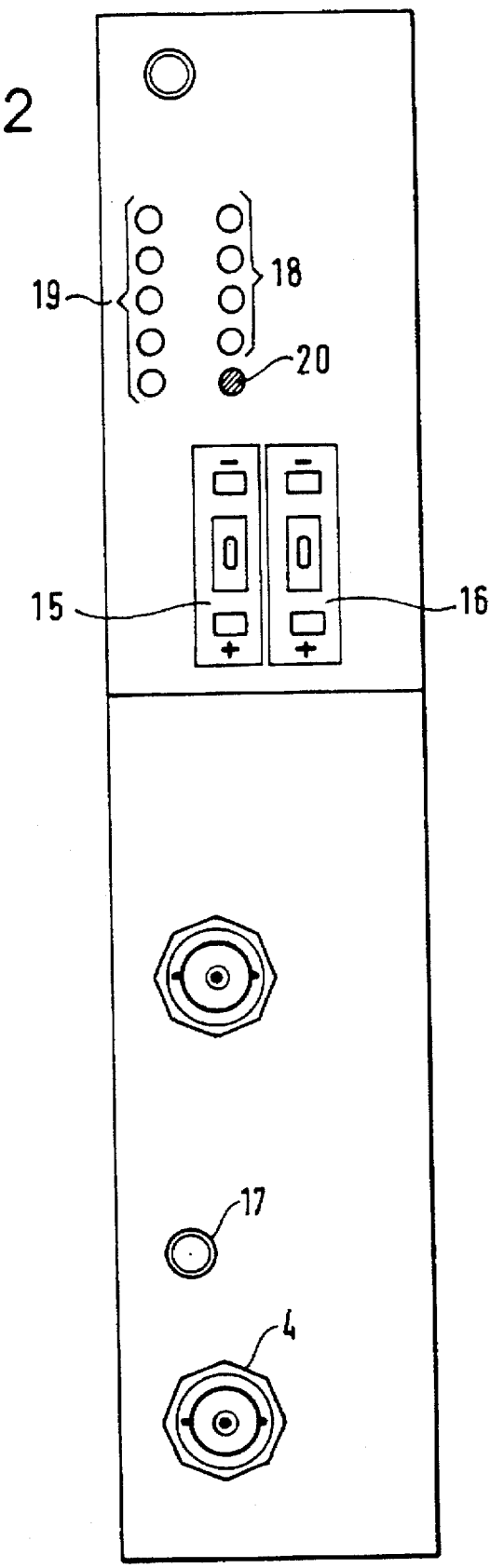
FIG. 2 is a diagram showing the outside face of a control panel for a path of the invention.
Figure 3:
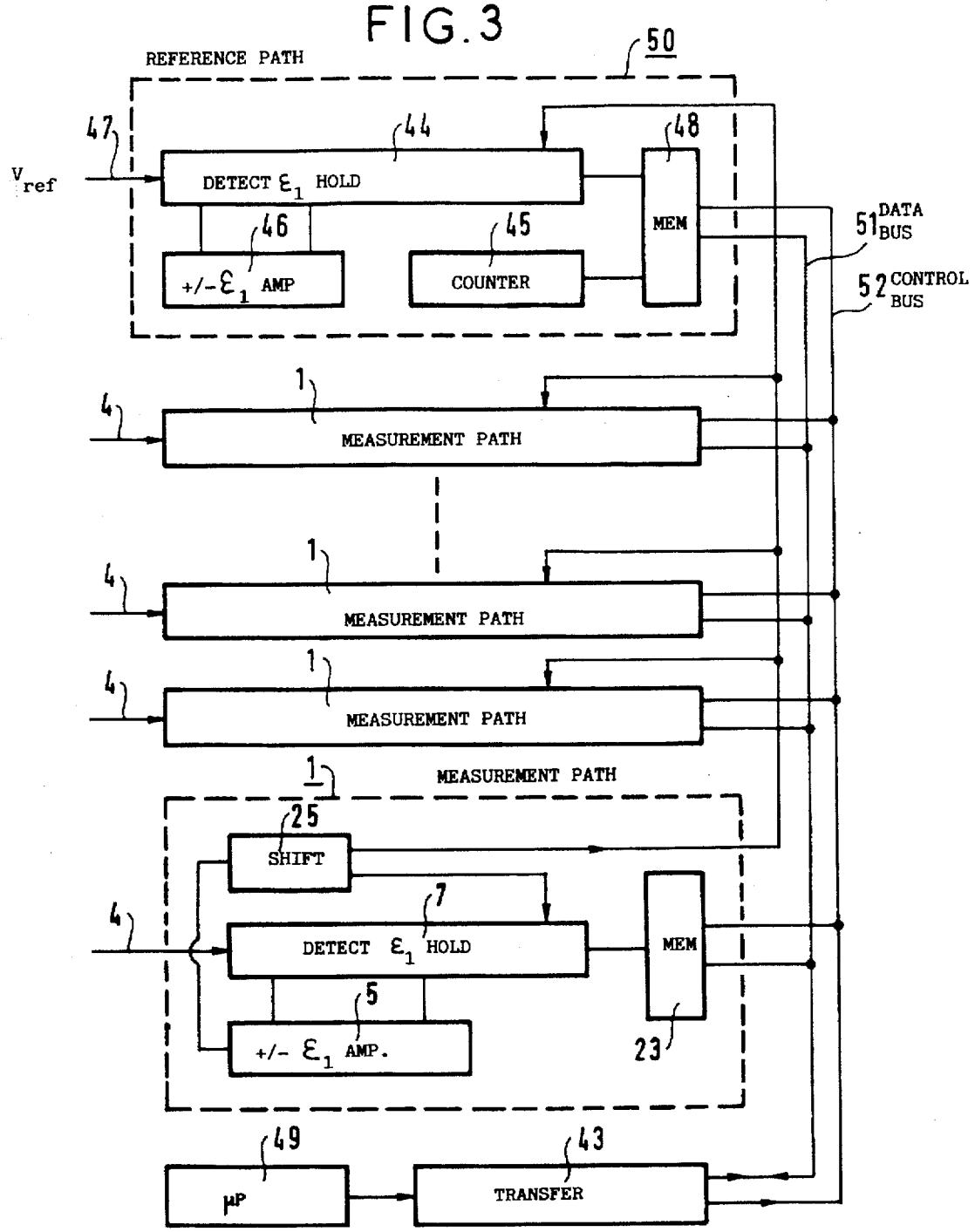
FIG. 3 is a block diagram of a system of the invention.

The path 1 of the invention comprises a path input 4 for a pulse signal detected at a measurement point on an electrical apparatus.

This path input 4 is connected to the input of a selection module 8 for selecting the rating of the signal being acquired.

The output of the selection module 8 is connected firstly to the input of a module 5 for determining polarity and limiting acquisition to determine the polarity of the input signal and to limit pulse acquisition to an input signal exceeding predetermined threshold values, and secondly to the input of a storage module 14 for storing parameters relating to the acquired signal.

The output of the module 5 for determining polarity and limiting acquisition is connected firstly to a control input of at least one detect-and-hold module 7 to detect the polarized peak value of the signal being acquired and to hold said value during a given length of time, and secondly to the internal input of a control module 6 for controlling acquisition and storage of the polarized peak value of the input signal if the input signal exceeds the predetermined threshold values.

The output of the control module 6 is connected to the control inputs of the storage module 14, and to the control inputs of at least one digitizing module 13 for digitizing the detected polarized peak value, and it has an external input/output 41.

The storage module has an external input/output 40.

Advantageously, the input 4 includes a reactance circuit for fixing the input impedance of the path, the high cutoff frequency of the passband, and for providing voltage protection for the downstream circuits.

The selection module 8 for selecting the rating appropriate to the signal being acquired comprises a plurality of measurement ranges 9 all of which are connected, upstream, to the path input 4, and downstream to automatic selection means 10 for automatically selecting the optimum measurement range 9 for the signal being acquired.

Each measurement range 9 includes its own detect-and-hold module 7.

Each measurement range 9 also includes at least one amplifier 11 of known gain and of known saturation voltage, and the automatic selection means comprise means for scanning the plurality of measurement ranges 9 in decreasing order of amplification gain, and means for selecting the first non-saturated measurement range 9 in scan order.

The detect-and-hold module 7 is advantageously located downstream from the amplifier 11 and upstream from the automatic selection means 10.

The detect-and-hold module 7 comprises analog detect-and-hold means 12 controlled by the module 5 for determining polarity and for limiting acquisition, and connected in series therewith, and a digitizing module 13 controlled by the control module 6.

Each digitizing module 13 is connected to the automatic selection means 10, said automatic selection means 10 being connected to the input of the storage module 14.

All of the outputs from the amplifiers 11 are also connected to controllable selection means 16 of the module 5 for determining polarity and for limiting acquisition. This selection means is controllable manually or by program. It selects one of the amplified signals. This controllable selection means is connected to the inputs of a set of two comparators 21 and of two bistables 22 that enable the polarity of the input signal to be determined, and that enable pulse acquisition to be limited to an input signal that exceeds the predetermined threshold values.

The module 5 for determining polarity and for limiting acquisition also includes means 15 for adjusting the threshold values and connected to the reference terminals of the comparators 21. The control outputs of the bistables are connected firstly to the internal input of the control module 6 and secondly to the control input of each of the detect-and-hold modules 12.

The control module 6 comprises shift means 25 for enabling the detect-and-hold modules 12 to detect peak values; means for controlling the digitizing modules 13; and means for controlling the storage module 14.

The control module 6 may also include its own processor. In the embodiment shown, the control module 6 is synchronized by an external processor connected to the external input of the control module 6.

The storage module conventionally comprises a memory 23 and a memory address generator 24 under the control of the control module 6. It further includes an external output for transferring stored data.

Advantageously, the path 1 includes a display module 17, 18, 19, and 20 that comprises, by way of non-limiting examples, means 17 for indicating that threshold values have been exceeded, means 18 for displaying the selected range, means 19 for displaying the amplitude of the signal in the selected range, and means 20 for displaying polarity.

The invention also includes a system for measuring partial discharges in an electrical apparatus.

Said system comprises: at least one path 1 as described above; a reference path 50 for digitizing and storing a polarized reference voltage of the electrical apparatus which may, by way of non-limiting example, be one of the power supply voltages of the electrical apparatus; and a transfer module 43 for transferring the polarized peak values as selected and stored in the storage module 14, and the associated data relating to the polarized reference voltage during acquisition into a common archive and post-treatment file located in a microcomputer 49 or equivalent. Each acquisition path 1 gives rise to a common file for archiving and post-treatment. The data contained in the file comprises, by way of non-limiting example, the amplitude of each detected discharge, its polarity, and its position in time, i.e. relative to the reference voltage (number of the reference period, and value of the reference voltage at the time of the pulse). The transfer means may be activated after each measurement, or at the end of a series of measurements (a measurement campaign), or whenever activity is low (no signal) on the path in consideration.

The reference path 50 comprises:
- a reference input 47 connected to a reference voltage;
- a module 46 for determining polarity and for limiting acquisition;
- a module 44 for detecting, holding and digitizing the polarized reference voltage;
- a module 45 for counting the periods of the reference voltage;
- a storage module 48 for storing the digitized polarized reference together with the number of the associated period;
- the set of modules in the reference path being caused to acquire the reference value by any of the acquisition paths 1 at the moment when the acquisition path 1 is itself acquiring a polarized peak value of a discharge.

The transfer module comprises a data bus 51 connected to the memories 23 and 48 of the paths 1 and 50, together with a control bus 52 for selecting the path to be put into communication with the microcomputer 49 or equivalent.

The microcomputer 49 or equivalent comprises processing means, display means, and means for outputting the common file or items obtained by processing said common file.

A measurement is acquired in the following steps:

A signal appears at the input 4 of a path 1. This signal is applied to all of the measurement ranges 9, and via the controllable selection means 16 to the module 5 for determining polarity and for limiting acquisition.

The module 5 for determining polarity and for limiting acquisition determines the polarity of the signal and compares the value of the signal with the threshold values, and in the event of the threshold values being exceeded, it generates a trigger command which is applied to all of the detect-and-hold modules 7, and to the control module 6 which begins a time delay using the shift means 25.

During the time delay, the detect-and-hold modules 7 have enough time to detect the peak value of the signal using their analog means 12. At the end of the time delay, the control module 6 activates the digitizing modules 13 so that they digitize the peak values of the signal.

During the time delay, or at the end thereof, the control module 6 generates an acquisition command for the reference path. This path acquires, digitizes, and stores the number of the period, and the polarized value of the reference voltage at that instant.

The automatic selection means 10 scan the measurement ranges in order of decreasing gain and select the first digitized value which is less than the saturation threshold of the measurement range from which it comes.

The control module 6 then causes the selected value to be stored, and then reinitializes the modules to wait for a new signal.

In a first embodiment, known as a "burst" embodiment, the transfer step occurs only at the end of a measurement campaign. This type of transfer suffices whenever it is desired to make a spot check on an apparatus.

In a second embodiment, referred to as a "continuous" embodiment, the transfer step takes place whenever there is a period of slack time between two acquisitions occurring in a measurement campaign. This type of transfer is necessary when an apparatus is under continuous surveillance and when it is desired to be able to process acquisitions without interrupting surveillance. This type of transfer is more effective in predictive maintenance.

Figure 4A:
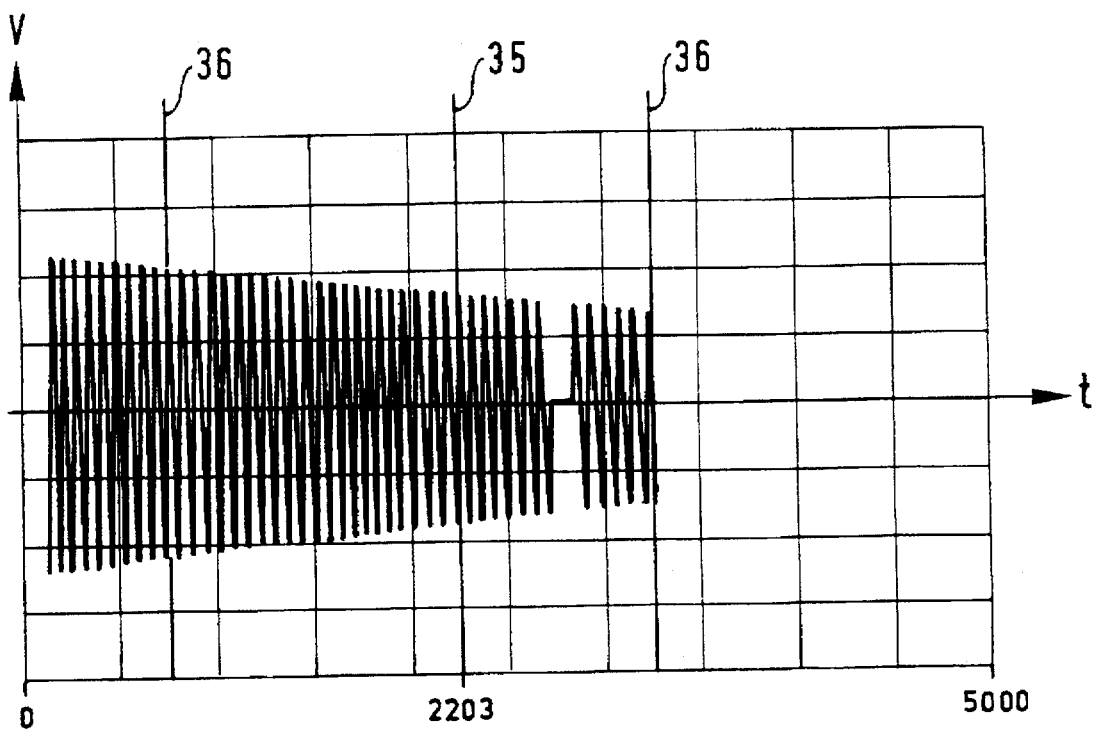
FIGS. 4A, 4B, 4C, and 4D are diagrams giving examples of how data can be displayed both before and after processing in accordance with the invention.
Figure 4B:
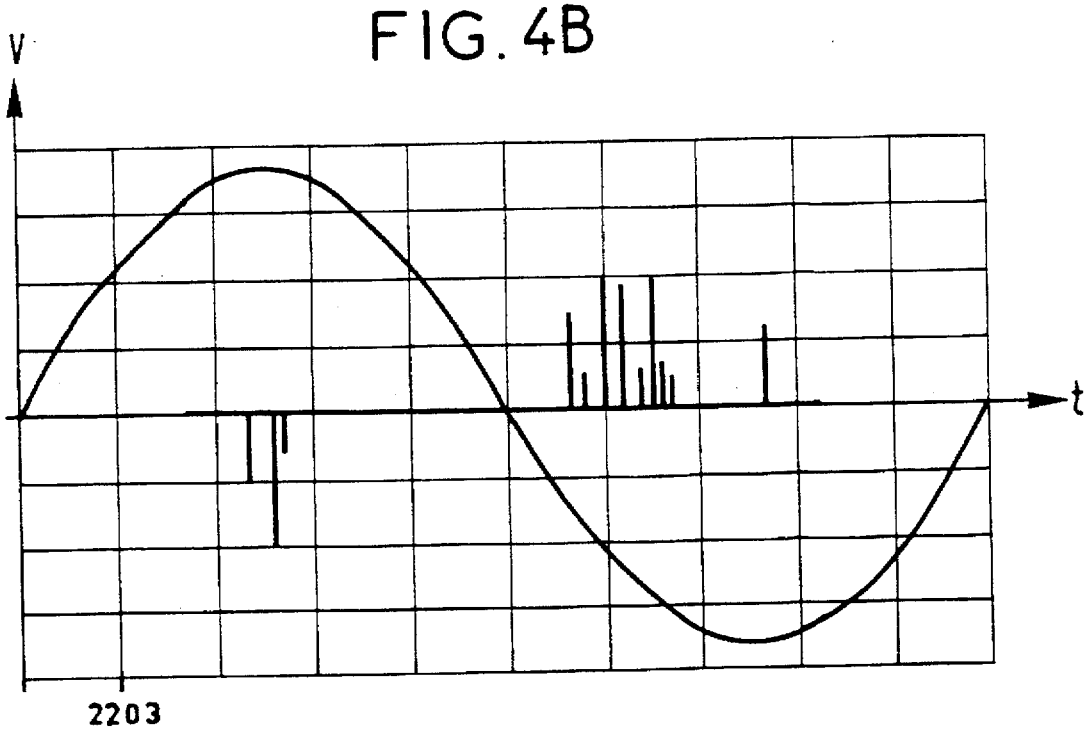
Figures 4C, 4D:
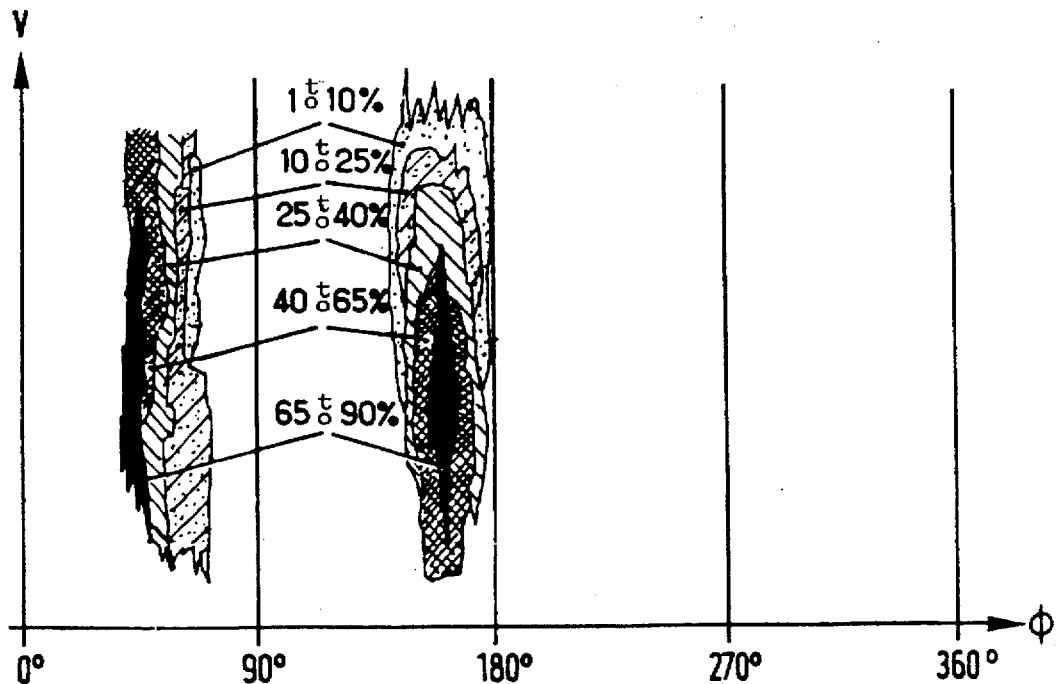

FIGS. 4A, 4B, 4C, and 4D show non-limiting examples of four possible displays that can be used in the invention.

The first display shows an entire measurement campaign.

The system includes cursor means 35, 36 serving firstly to select any particular period in the reference voltage for the measurement campaign, and secondly to select a portion only of the measurement campaign.

The second display shows the amplitude and the polarity of discharges that occurred during the period selected by the cursor 35 in the preceding display.

The third display gives a list of predetermined parameters calculated on the basis of the portion of the measurement campaign selected by the cursors 36 in the first display.

The four display provides a diagram showing the occurrence of discharges as a function of their amplitudes and phase offsets relative to the reference voltage.

We claim:

1. A path for acquiring a voltage pulse measured in an electrical apparatus, said path comprising:
    a path input for a pulse signal detected at a measurement point of said electrical apparatus;
    a module for determining polarity and for limiting acquisition to detect the polarity of the input signal and to limit pulse acquisition to input signals exceeding predetermined threshold values;
    a control module for controlling acquisition and storage of the polarized peak value of the input signal if the input signal exceeds the predetermined threshold values;
    a detect-and-hold module for detecting the polarized peak value of the signal being acquired and for holding it during a predetermined given length of time; and
    a selection module for selecting a measurement range for measuring the signal being acquired, the selection module having a plurality of measurement ranges, all connected at their upstream ends to the input of the path, and all connected at their downstream ends to automatic selection means for automatically selecting the measurement range which is optimum for the signal in acquisition.

2. An acquisition path according to claim 1, wherein each measurement range includes a detect-and-hold module.

3. An acquisition path according to claim 1, wherein each measurement range includes an amplifier of known gain and of known saturation voltage, the automatic selection means including means for scanning the plurality of measurement ranges in order of decreasing amplifier gain, and means for selecting the first non-saturated measurement range in scan order.

4. An acquisition path according to claim 3, wherein the detect-and-hold module is located downstream from the amplifier and upstream from the automatic selection means.

5. An acquisition path according to claim 1, wherein the detect-and-hold module comprises analog detect-and-hold means connected in series with digitizing means for digitizing the detected polarized peak value.

6. An acquisition path according to claim 1, including a storage module for storing the detected polarized peak value as selected and made available at the output of the automatic selection means.

7. An acquisition path according to claim 1, including adjustment means for adjusting the predetermined threshold values, and controllable selection means for selecting the measurement range to be connected to the module for determining polarity and for limiting acquisition.

8. A system for measuring partial discharges in an electrical apparatus, the system comprising:
    at least one acquisition path comprising:
        a path input for a pulse signal detected at a measurement point of said electrical apparatus;
        a module for determining polarity and for limiting acquisition to detect the polarity of the input signal and to limit pulse acquisition to input signals exceeding predetermined threshold values;
        a control module for controlling acquisition and storage of the polarized peak value of the input signal if the input signal exceeds the predetermined threshold values;
        a detect-and-hold module for detecting the polarized peak value of the signal being acquired and for holding it during a predetermined given length of time; and
        a selection module for selecting a measurement range for measuring the signal being acquired, the selection module having a plurality of measurement ranges, all connected at their upstream ends to the input of the path, and all connected at their downstream ends to automatic selection means for automatically selecting the measurement range which is optimum for the signal in acquisition;
    a reference path for digitizing and storing the polarized feed voltage of the electrical apparatus synchronously with the acquisition path; and
    a transfer module for transferring to a common archive file located in a microcomputer or equivalent, the digital polarized peak values as stored in the storage module of the acquisition path, together with the associated feed polarized voltage as stored in the reference path.

9. A system according to claim 8, including means for processing the data in the common file and display means and means for outputting said data or the results of processing said data.

10. A system according to claim 8, comprising seven acquisition paths and one reference path, each acquisition path having four measurement ranges which in combination provide a dynamic measurement range of about one to one million.

11. A method of measuring partial discharges and of processing said measurements using a measurement system comprising:
    at least one acquisition path comprising:
        a path input for a pulse signal detected at a measurement point of said electrical apparatus;
        a module for determining polarity and for limiting acquisition to detect the polarity of the input signal and to limit pulse acquisition to input signals exceeding predetermined threshold values;
        a control module for controlling acquisition and storage of the polarized peak value of the input signal if the input signal exceeds the predetermined threshold values;
        a detect-and-hold module for detecting the polarized peak value of the signal being acquired and for holding it during a predetermined given length of time; and
        a selection module for selecting a measurement range for measuring the signal being acquired, the selection module having a plurality of measurement ranges, all connected at their upstream ends to the input of the path, and all connected at their downstream ends to automatic selection means for automatically selecting the measurement range which is optimum for the signal in acquisition;

a reference path for digitizing and storing the polarized feed voltage of the electrical apparatus synchronously with the acquisition path; and a transfer module for transferring to a common archive file located in a microcomputer or equivalent, the digital polarized peak values as stored in the storage module of the acquisition path, together with the associated feed polarized voltage as stored in the reference path;

wherein several acquisition paths are connected to measurement points selected in the electrical apparatus, and the reference path is connected to one of the feed voltages of the electrical apparatus;

for each acquisition path, the method comprising the steps of:

making an input signal available for the acquisition path, and distributing this signal among all of the measurement ranges and via the controllable selection means in the module for determining polarity and limiting acquisition;

using the module for determining polarity and limiting acquisition to determine the polarity of the signal and compare the value of the signal with the threshold values, and when said threshold values are exceeded, generating a trigger command applied to all of the detect-and-hold modules and to the control module which starts a time delay using the shift means;

during the time delay, using the detect-and-hold modules to detect the peak value of the signal by using the analog means;

during the time delay, or at the end thereof, using the control module to generate an acquisition command for the reference path which then acquires, digitizes, and stores the number of the period and the polarized value of the reference voltage at said instant;

at the end of the time delay, causing the control module to control the digitizing means to digitize the peak value of the signal;

using the automatic selection means to scan the measurement ranges in order of decreasing gain, and to select the first digitized value which is below the saturation threshold of the measurement range from which it is delivered;

operating the control module to cause the selected value to be stored in the storage module, and then to reset the modules to zero to wait for a new signal; and transferring the data collected in this way into the common file for archive purposes and/or for post-treatment purposes.

12. A method according to claim 11, wherein the transfer step takes place at the end of a measurement campaign lasting a given time.

13. A method according to claim 11, wherein the transfer step takes place during a measurement campaign, in idle periods during which no discharge is being detected.

* * * * *